(12) United States Patent
Huang et al.

(10) Patent No.: US 9,148,096 B2
(45) Date of Patent: Sep. 29, 2015

(54) DEVICE AND METHOD FOR CONTROLLING AN INPUT SIGNAL OF A POWER AMPLIFIER

(75) Inventors: Tao Huang, Beijing (CN); Changjiang Yang, Beijing (CN); Xiang Zeng, Beijing (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/377,959

(22) PCT Filed: Feb. 22, 2012

(86) PCT No.: PCT/CN2012/071460
§ 371 (c)(1),
(2), (4) Date: Aug. 11, 2014

(87) PCT Pub. No.: WO2013/123651
PCT Pub. Date: Aug. 29, 2013

(65) Prior Publication Data
US 2015/0022269 A1    Jan. 22, 2015

(51) Int. Cl.
| | |
|---|---|
| H03F 3/19 | (2006.01) |
| H04L 27/26 | (2006.01) |
| H04L 27/36 | (2006.01) |
| H03F 1/32 | (2006.01) |

(Continued)

(52) U.S. Cl.
CPC .. *H03F 3/19* (2013.01); *H03F 1/02* (2013.01); *H03F 1/3247* (2013.01); *H03F 3/24* (2013.01); *H04L 27/2623* (2013.01); *H04L 27/368* (2013.01); *H03F 2200/451* (2013.01); *H03F 2201/3215* (2013.01); *H03F 2201/3227* (2013.01); *H04B 2201/70706* (2013.01)

(58) Field of Classification Search
CPC .............. H04L 27/2623; H04L 27/368; H04L 27/3411; H04B 1/0475; H04B 2201/70706; H03F 3/19; H03F 1/02; H03F 3/24; H03F 1/3247
See application file for complete search history.

(56) References Cited

U.S. PATENT DOCUMENTS

| | | | | |
|---|---|---|---|---|
| 7,280,841 | B2 * | 10/2007 | Goldberg et al. ............. | 455/522 |
| 7,634,024 | B2 * | 12/2009 | Tan ................................ | 375/297 |
| 7,711,069 | B2 * | 5/2010 | Shako et al. ................... | 375/296 |

(Continued)

FOREIGN PATENT DOCUMENTS

| | | |
|---|---|---|
| CN | 101562478 | 10/2009 |
| CN | 101969423 | 2/2011 |

OTHER PUBLICATIONS

Wanzhi Ma et al., "Adaptive Step Size for OFDM CFR with Cognitive Clipping," Wireless Communications and Networking and Mobile Computing (WICOM), IEEE, Sep. 23, 2010, pp. 1-4.*

(Continued)

*Primary Examiner* — Sophia Vlahos
(74) *Attorney, Agent, or Firm* — Baker Botts, LLP

(57) ABSTRACT

A method for controlling an input signal of a power amplifier is provided. The method comprise applying CFR to the input signal to obtain a processed input signal; determining a minimum CFR threshold; comparing the peak power of the power amplifier and an allowable peak power; and if the peak power is below the allowable peak power, determining a final CFR threshold by increasing the minimum CFR threshold, or if the peak power is not below the allowable peak power, reducing the average output power until peak power reaches the allowable peak power.

16 Claims, 5 Drawing Sheets

301

(51) Int. Cl.
*H03F 3/24* (2006.01)
*H03F 1/02* (2006.01)

(56) References Cited

U.S. PATENT DOCUMENTS

| | | | | |
|---|---|---|---|---|
| 7,944,991 | B2* | 5/2011 | Zhao et al. | 375/296 |
| 8,073,073 | B2* | 12/2011 | Navidpour et al. | 375/296 |
| 8,098,761 | B2* | 1/2012 | Chan et al. | 375/297 |
| 8,340,210 | B2* | 12/2012 | Haddad | 375/295 |
| 8,416,893 | B2* | 4/2013 | Gandhi et al. | 375/345 |
| 8,731,104 | B2* | 5/2014 | Peroulas et al. | 375/296 |
| 2007/0140367 | A1 | 6/2007 | Braithwaite | |
| 2007/0140376 | A1 | 6/2007 | Kang | |

OTHER PUBLICATIONS

International Search Report for International Application No. PCT/CN2012/071460, Nov. 8, 2012.

PCT Notification Concerning Transmittal of International Preliminary Report on Patentability (Chapter I of the Patent Cooperation Treaty) for International application No. PCT/CN2012/071460, Aug. 26, 2014.

* cited by examiner

DEVICE AND METHOD FOR CONTROLLING AN INPUT SIGNAL OF A POWER AMPLIFIER

PRIORITY

This nonprovisional application is a U.S. National Stage Filing under 35 U.S.C. §371 of International Patent Application Serial No. PCT/CN2012/071460, filed Feb. 22, 2012 and entitled "Device and Method for Controlling an Input Signal of a Power Amplifier."

TECHNICAL FIELD

This invention is related to crest factor reduction (CFR) in communication systems, particularly crest factor reduction in signal transmitter.

BACKGROUND

Current wireless communication systems use spectral efficiency modulation of RF carriers (e.g. W-CDMA, LTE, WiMAX, and MSR). In these systems, radio downlink signal is characterized to have high peak-to-average ratio (PAR). To amplify such signal, it is required to use high-linearity power amplifier (PA), which results in low PA efficiency and high cost. CFR algorithms are widely used to reduce PAR. CFR with proper threshold can significantly reduce PAR while having acceptable error vector magnitude (EVM) degradation, leading to improved efficiency and reduced cost.

Different CFR thresholds result in different EVM performance and PAR values. Higher threshold means worse (higher) PAR but better EVM, while lower threshold means better (lower) PAR and worse EVM. EVM is limited by modulation accuracy requirement and PAR is limited by average power level and PA peak power capability. CFR thresholds and average power level should be properly selected so that good EVM can be achieved while peak power value, which can be calculated as the sum of PAR and average power level, do not exceed PA peak power capability.

PAR and EVM is decided not only by CFR threshold, but also by carrier configurations, for example, carrier radio standards, carrier numbers, modulation types, carrier frequency spacing and power allocation among carriers.

CFR thresholds and average power levels are normally predefined for different carrier configurations. This is all right when radio units support limited carrier configurations. But now, modern radio units are expected to support complex carrier configurations including multi-standards radio, multi carrier numbers, different modulation types, wide instantaneous band width (IBW), and flexible power allocation among different carriers. See FIGS. 1 and 2. There are thousands of different carrier combinations, so it is impossible to set or predefine CFR threshold and average power level for every possible carrier configuration.

One possible solution is to divide all carrier configurations into several groups and use a general rule for each group. In order to have all carrier configurations in the group to meet EVM and PA peak power capability requirement, the worst carrier configuration defines CFR threshold and average power level settings. Drawback is that the settings are not optimized for each carrier configuration. This results in hardware capability waste and it is a time consuming task to find general rules for different groups.

And since the same clipping thresholds are used for all radio units, radio unit with the lowest PA peak power capability is used to define target PAR for clipping. This results in waste of hardware performance.

The document CN101969423A describes a method for setting CFR threshold based on the output of PA. The disclosed embodiments improve the efficiency and precise of PA. However, this document focuses on TD-SCDMA and LTE communication systems only, and it is questionable as to whether it is applicable to other systems. Besides, the disclosed solutions can not obtain optimized EVM.

SUMMARY

It is the object to obviate at least one of the above disadvantages and provide improve solutions.

A method for controlling an input signal of a power amplifier is provided. The method comprise applying crest factor reduction to the input signal to obtain a processed input signal; determining a minimum crest factor reduction threshold such that an error vector magnitude degradation caused by crest factor reduction reaches a maximum acceptable error vector magnitude degradation; comparing Peak-to-Average Ratio of the processed input signal plus an average output power of the power amplifier and an allowable peak power of the power amplifier; and if the Peak-to-Average Ratio plus the average output power is below the allowable peak power, determining a final crest factor reduction threshold by increasing the minimum crest factor reduction threshold until the Peak-to-Average Ratio plus the average output power reaches the allowable peak power, or if the Peak-to-Average Ratio plus the average output power is not below the allowable peak power, determining the final crest factor reduction threshold to be the minimum crest factor reduction threshold, and reducing the average output power until Peak-to-Average Ratio plus the average output power reaches the allowable peak power.

A device for controlling an input signal of a power amplifier is provided. The device comprises a crest factor reduction unit for applying crest factor reduction to the input signal to obtain a processed input signal; a minimum crest factor reduction threshold determiner configured for determining a minimum crest factor reduction threshold such that an error vector magnitude degradation caused by crest factor reduction reaches a maximum acceptable error vector magnitude degradation; a power comparator configured for comparing Peak-to-Average Ratio of the processed input signal plus an average output power of the power amplifier and an allowable peak power of the power amplifier; a final crest factor reduction threshold determiner configured for determining the final crest factor reduction threshold by increasing the minimum crest factor reduction threshold until Peak-to-Average Ratio plus the average output power reaches the allowable peak power if the Peak-to-Average Ratio plus the average output power is below the allowable peak power, or determining the final crest factor reduction threshold to be the minimum crest factor reduction threshold if Peak-to-Average Ratio plus the average output power is not below the allowable peak power; and an average output power control unit configured for reducing the average output power until Peak-to-Average Ratio plus the average output power reaches the allowable peak power if the Peak-to-Average Ratio plus the average output power is not below the allowable peak power.

A computer readable medium, with computer code thereon for controlling an input signal of a power amplifier, is provided. The computer readable medium comprises: instructions for applying crest factor reduction to the input signal to obtain the processed input signal; instructions for determining a minimum crest factor reduction threshold such that an error vector magnitude degradation caused by crest factor reduction reaches a maximum acceptable error vector magnitude degradation; instructions for comparing Peak-to-Average Ratio of the processed input signal plus an average output power of the power amplifier and an allowable peak power of the power amplifier, instructions for determining a final crest factor reduction threshold by increasing the minimum crest factor reduction threshold until Peak-to-Average Ratio plus the average output power reaches the allowable peak power when Peak-to-Average Ratio plus the average output power is below the allowable peak power, and instructions for determining the final crest factor reduction threshold to be the minimum crest factor reduction threshold and reducing the average output power until Peak-to-Average Ratio plus the average output power reaches the allowable peak power when Peak-to-Average Ratio plus the average output power is not below the allowable peak power.

A device for controlling an input signal of a power amplifier is provided. The device comprises a crest factor reduction unit, an average power meter connected with an output of the crest factor reduction unit, a peak power meter connected with the output of the crest factor reduction unit, a Peak-to-Average Ratio meter configured for determining Peak-to-Average Ratio according to outputs of the average power meter and the peak power meter, and for determining whether Peak-to-Average Ratio plus an average output power of the power amplifier is below an allowable peak power of the power amplifier, a error vector magnitude calculator, with inputs from both the output of the average power level controller and the output of the crest factor reduction unit, a threshold determiner configured for determining crest factor reduction threshold based on outputs of the Peak-to-Average Ratio meter and the error vector magnitude calculator, and an average power level controller configured for controlling average power level of the input signal based on the output of the Peak-to-Average Ratio meter.

A signal transmitter is provided. The signal transmitter comprises a signal source, a power amplifier, a signal processor for processing a signal from the signal source for the power amplifier, wherein the signal processor comprising: a crest factor reduction unit, an average power meter connected with the output of the crest factor reduction unit, a peak power meter connected with the output of the crest factor reduction unit, a Peak-to-Average Ratio meter configured for determining Peak-to-Average Ratio according to an output of the average power meter and the peak power meter, and for determining whether Peak-to-Average Ratio plus an average output power of the power amplifier is below an allowable peak power of the power amplifier, a error vector magnitude calculator, with inputs from both the output of the average power level controller and the output of the crest factor reduction unit, a threshold determiner configured for determining crest factor reduction threshold based on the output of the Peak-to-Average Ratio meter and the error vector magnitude calculator, and an average power level controller configured for controlling average power level of the signal from the signal source based on the output of the Peak-to-Average Ratio meter.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

A detailed description is now provided with reference to the accompanying drawings. One skilled in the art may realize that the following description is illustrative only and is not in any way limiting. Other embodiments of the present invention may readily suggest themselves to such skilled persons having the benefit of this disclosure.

Figure 1:
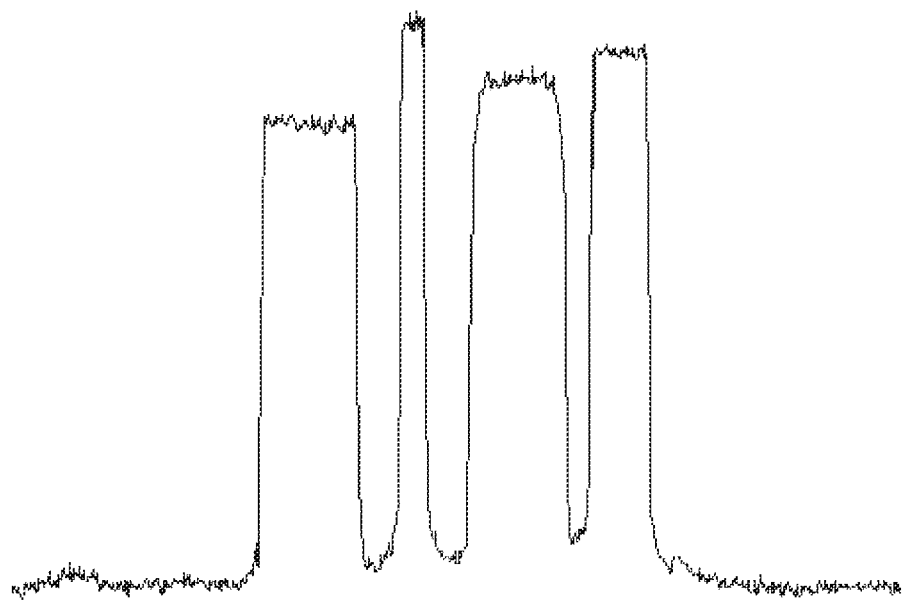
FIGS. 1 and 2 are waveforms illustrating different carrier configurations.
Figure 2:
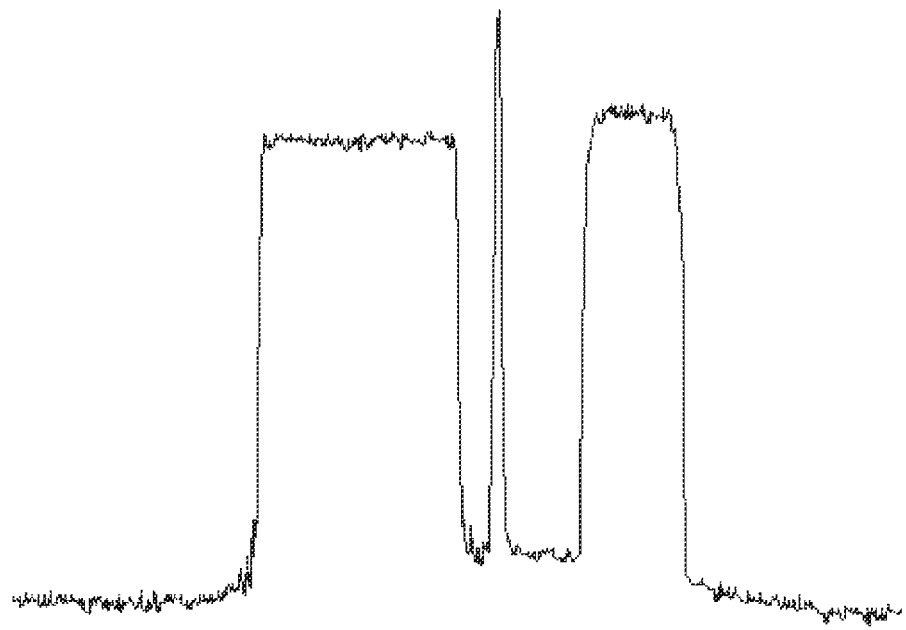
Figure 3:
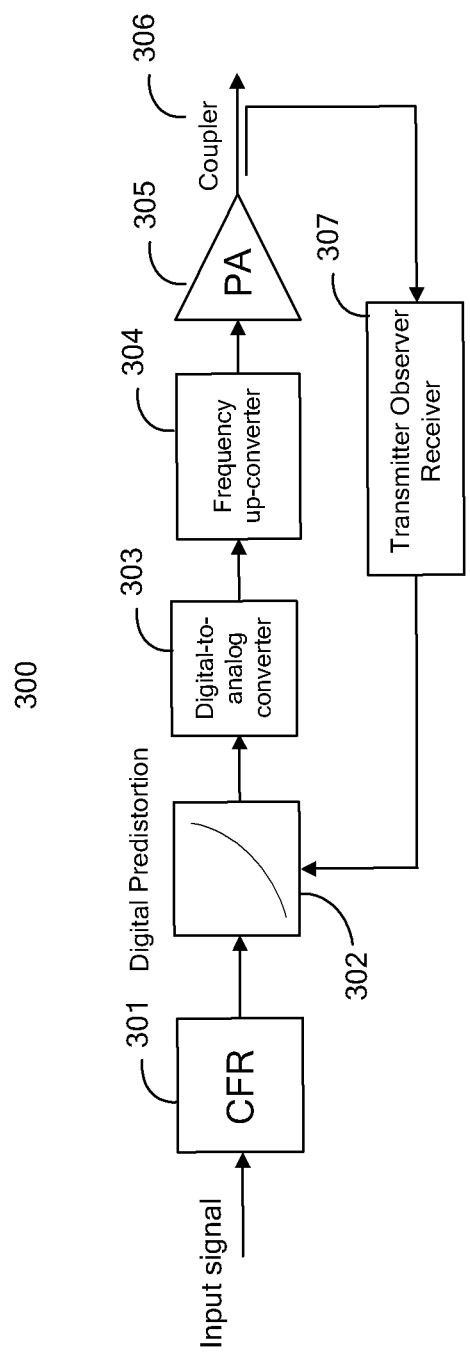
FIG. 3 is a block diagram illustrating a transmitter device.

FIG. 3 is a block diagram of a transmitter device used in communication systems, particularly in wireless communication systems. In FIG. 3, the transmitter device 300 is a device transmitting communication signals with RF carriers, e.g. W-CDMA, LTE, WiMAX, and MSR carriers. Two examples of the transmitter device are base station and terminal device.

The transmitter device 300 may include a CFR device 301, a digital predistortion device (DPD) 302, a digital-to-analog converter (DAC) 303, a frequency up-converter 304, a power amplifier 305, a coupler 306, and a transmitter observer receiver 307. The digital-to-analog converter 303 is a device that converts a digital signal, which in FIG. 3 is the output of the DPD 302, to an analog signal. The frequency up-converter 304 (or radio frequency modulator) is a device that takes a baseband input signal and outputs a radio frequency-modulated signal. The power amplifier 305 is a type of electronic amplifier used to convert a low-power radio frequency signal into a larger signal of significant power. The coupler 306 is a passive device used to couple a defined amount of the radio frequency power in a transmission line to another port where it can be used in Transmitter Observer Receiver 307.

Figure 4:
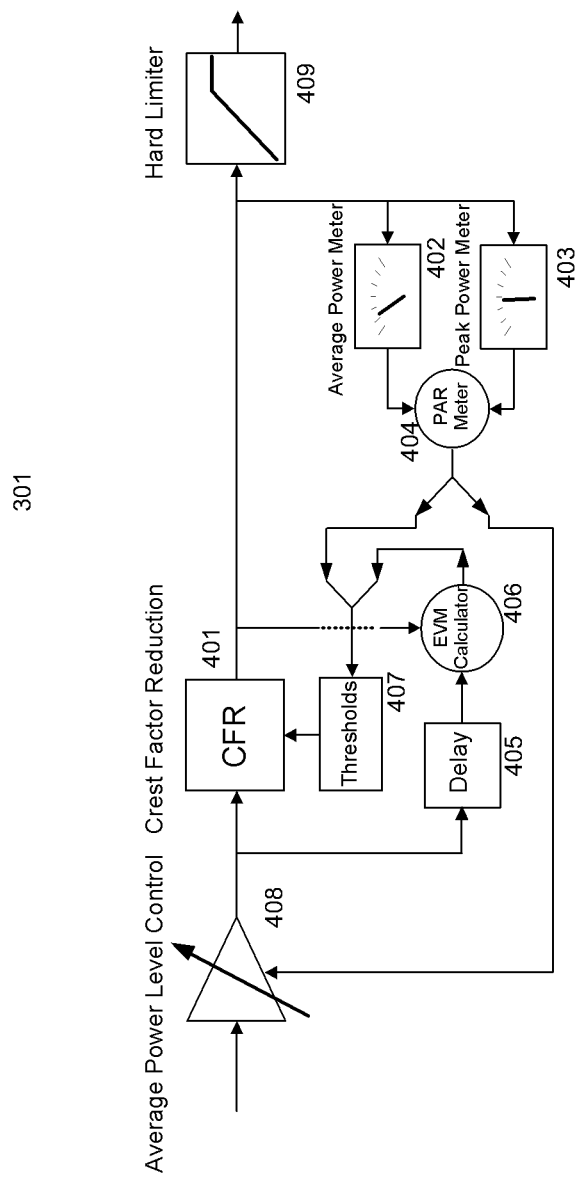
FIG. 4 is a block diagram illustrating a CFR device.

FIG. 4 is a block diagram of the CFR device shown in FIG. 3. In FIG. 4, the CFR device 301 includes a CFR unit 401, which applies the CFR process by clipping the magnitude of the input signal to a certain level to decrease the PAR prior to transmission. The CFR device 301 also includes a threshold determiner 407 for determining CFR threshold. From the perspective of power amplifier efficiency, the CFR threshold is preferably low. This is because a low CFR threshold brings low PAR. On the other hand, from the perspective of preventing distortion, the CFR threshold is preferably high. Therefore, the threshold determiner 407 will strike a balance between the power amplifier efficiency and distortion prevention.

The CFR device 301 further includes a Peak-to-Average Ratio meter 404 and an error vector magnitude calculator 406. They are used to provide reference information for the threshold determiner 407 to make the decision. The Peak-to-Average Ratio meter 404 determines Peak-to-Average Ratio of the output of the CFR unit 401. The average power of the output of the CFR unit 401 is obtained by the average power meter 402. The peak power of the output of the CFR unit 401 is obtained by the Peak power meter 403. The average power meter 402 and the Peak power meter 403 provide outputs into the Peak-to-Average Ratio meter 404. Besides, the Peak-to-Average Ratio meter 404 also determines whether Peak-to-Average Ratio plus an average output power of the power amplifier is below an allowable peak power of the power amplifier. The EVM calculator 406 compares the input and the output of the CFR unit 401 to calculate the EVM value.

The CFR device 301 further includes an average power level controller 408 to control the average power level of the input of the CFR unit 401. It is possible that, after CFR threshold adapting process, error vector magnitude degradation caused by crest factor reduction reaches a maximum acceptable error vector magnitude degradation and Peak-to-Average Ratio plus the average output power is not below the allowable peak power. Under this situation, the average power level controller 408 can control average power level of the input of the CFR unit 401 to resolve this problem. As shown in FIG. 4, the average power level controller 408 takes signal from the PAR meter 404 as reference to decide when to function.

The CFR device 301 may further include a hard limiter 409 to limit the output of the CFR unit 401. This is to avoid overly high output of the CFR unit 401 during the CFR threshold adapting process, which may damage the subsequent components, e.g. the digital predistortion 302, the digital-to-analog converter 303, the frequency up-converter 304, the power amplifier 305, etc, as shown in FIG. 3.

The CFR device 301 may further include a delay unit 405. As shown in FIG. 4, the delay unit 405 can be disposed between the average power level controller 408 and the error vector magnitude calculator 406. The delay unit 405 delays the signal from the average power level controller 408 to compensate for the time taken to perform CFR at the CFR unit. The delay unit can help the EVM calculator 406 to obtain a better result and consequently, improve the precise of the CFR threshold adjustment.

Figure 5:
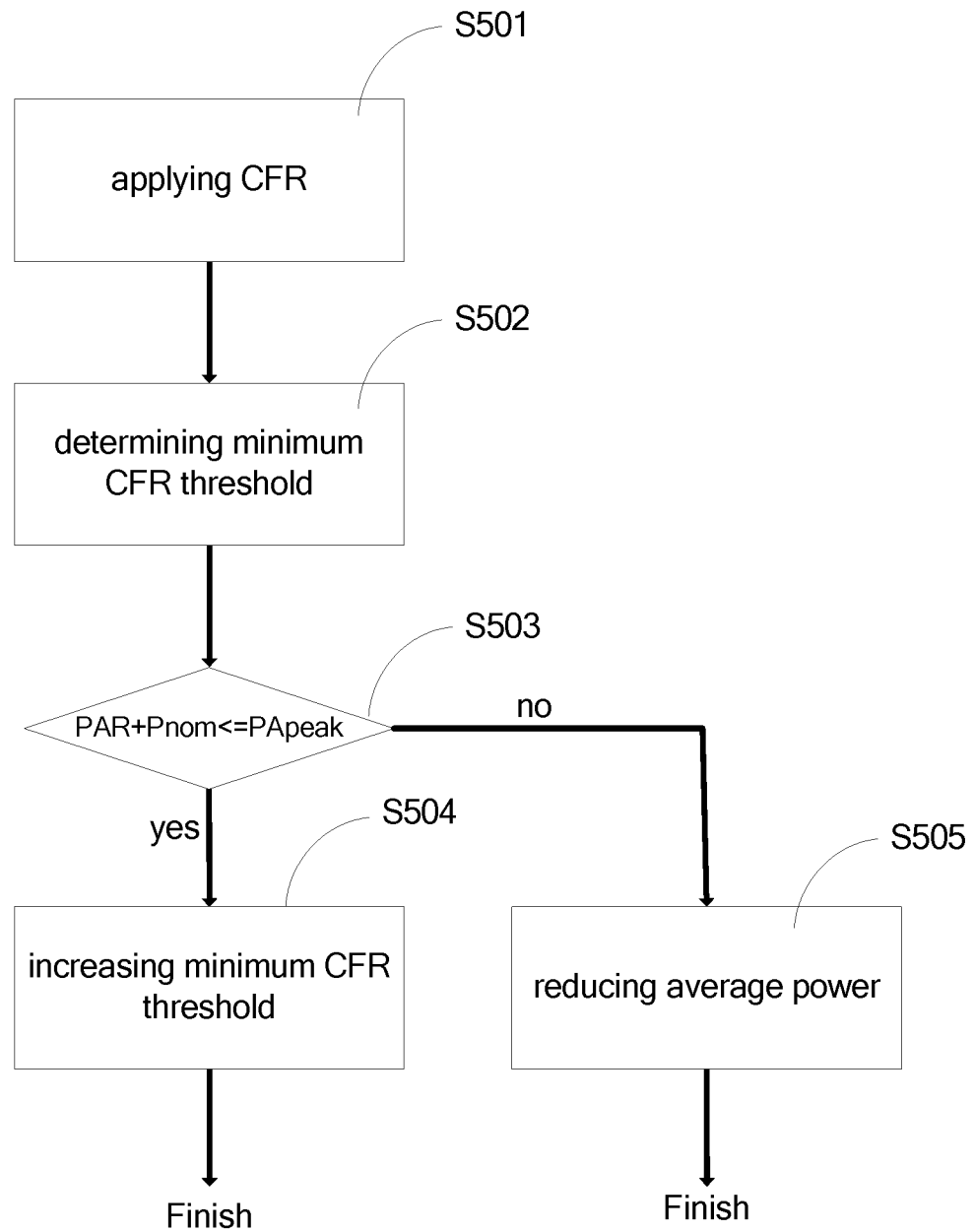
FIG. 5 is a flowchart illustrating an embodiment of method steps.

FIG. 5 is a flowchart of a method for controlling an input signal of a power amplifier in accordance with an example embodiment. With this method, the EVM of the input signal of the power amplifier can be controlled and optimized, while the efficiency of the power amplifier can be guaranteed.

In step S501, crest factor reduction is applied to the input signal to obtain a CFR-processed input signal. The crest factor reduction is performed with a initial crest factor reduction threshold, and the performance may be not acceptable at the initial time but can be improved through the following steps.

In step S502, a minimum crest factor reduction threshold is determined under the requirement that an error vector magnitude degradation caused by crest factor reduction reaches maximum acceptable error vector magnitude degradation. As a general rule, lower threshold means worse EVM. So when the EVM is just at the critical value, the corresponding CFR threshold is the minimum CFR threshold.

In step S503, Peak-to-Average Ratio of the processed input signal (PAR) and the average output power of the power amplifier (Pnom) are added. The result, i.e. the peak power, is compared with a predetermined allowable peak power of the power amplifier (PApeak).

If the Peak-to-Average Ratio plus the average output power is below the allowable peak power, it is determined that there is still room to optimize the EVM. Under this situation, the process goes to step S504, in which a final crest factor reduction threshold is determined by increasing the minimum crest factor reduction threshold until the Peak-to-Average Ratio plus the average output power reaches the allowable peak power. At this point, optimized EVM is obtained while the peak power of the output of the PA is within safe area.

Or otherwise, if the Peak-to-Average Ratio plus the average output power is not below the allowable peak power, then the process goes to step S505, in which the final crest factor reduction threshold is determined to be the minimum crest factor reduction threshold, and the average power of the input signal is reduced until Peak-to-Average Ratio plus the average output power reaches the allowable peak power.

Through these steps, CFR threshold and average power level are automatically optimized, leading to guaranteed EVM performance and wanted PAR.

Step S502 can be performed through, among others, the following operations. First, the error vector magnitude degradation caused by crest factor reduction is compared with the maximum acceptable error vector magnitude degradation. Second, if the error vector magnitude degradation is below the maximum acceptable error vector magnitude degradation, the crest factor reduction threshold is decreased until the error vector magnitude degradation reaches the maximum acceptable error vector magnitude degradation, or if the error vector magnitude degradation is not below the maximum acceptable error vector magnitude degradation, the crest factor reduction threshold is increased until the error vector magnitude degradation reaches the maximum acceptable error vector magnitude degradation. With these steps, the minimum crest factor reduction threshold can be obtained without recognizing and analyzing the details of carrier configurations.

The method for controlling the input signal of a power amplifier can further comprises limiting the processed input signal. This is to avoid overly high output of the processed input signal. This undesired situation may appear during the adaptive process and can damage the related components. With this limiting step, the safety of the components can be further enhanced.

In step S504, the minimum crest factor reduction threshold can be increased step by step. The step length can be determined based on difference between Peak-to-Average Ratio plus the average output power and the allowable peak power. For example, if the difference is relative large, the step can be set to be longer. On the other hand, if the difference is relative small, the step can be set to be shorter. Likewise, when decreasing or increasing the crest factor reduction threshold, the step length can also be determined based on the current value and the target value. The variable step length configuration provides fast and meanwhile precious adjustment.

The method as shown in FIG. 5 can be implemented by a device for controlling an input signal of a power amplifier. The device includes a CREST FACTOR REDUCTION unit, a minimum CREST FACTOR REDUCTION threshold determiner, a power comparator, a final CREST FACTOR REDUCTION threshold determiner, and an average output power control unit.

The CREST FACTOR REDUCTION unit applies CREST FACTOR REDUCTION to the input signal to obtain a processed input signal; the minimum CREST FACTOR REDUCTION threshold determiner configured for determining a minimum CREST FACTOR REDUCTION threshold such that an ERROR VECTOR MAGNITUDE degradation caused by CREST FACTOR REDUCTION reaches a maximum acceptable ERROR VECTOR MAGNITUDE degradation; the power comparator configured for comparing Peak-to-Average Ratio of the processed input signal plus an average output power of the power amplifier and an allowable peak power of the power amplifier; the final CREST FACTOR REDUCTION threshold determiner configured for determining the final CREST FACTOR REDUCTION threshold by increasing the minimum CREST FACTOR REDUCTION threshold until Peak-to-Average Ratio plus the average output power reaches the allowable peak power if the Peak-to-Average Ratio plus the average output power is below the allowable peak power, or determining the final CREST FACTOR REDUCTION threshold to be the minimum CREST FACTOR REDUCTION threshold if Peak-to-Average Ratio plus the average output power is not below the allowable peak power; and the average output power control unit configured for reducing the average output power until Peak-to-Average Ratio plus the average output power reaches the allowable peak power if the Peak-to-Average Ratio plus the average output power is not below the allowable peak power.

In the above described device, the minimum CREST FACTOR REDUCTION threshold determiner can comprise an ERROR VECTOR MAGNITUDE comparator and a CREST FACTOR REDUCTION threshold adjuster.

The ERROR VECTOR MAGNITUDE comparator is configured for comparing the ERROR VECTOR MAGNITUDE degradation caused by CREST FACTOR REDUCTION with the maximum acceptable ERROR VECTOR MAGNITUDE degradation; the CREST FACTOR REDUCTION threshold adjuster is configured for decreasing the CREST FACTOR REDUCTION threshold until the ERROR VECTOR MAGNITUDE degradation caused by CREST FACTOR REDUCTION reaches the maximum acceptable ERROR VECTOR MAGNITUDE degradation if the ERROR VECTOR MAGNITUDE degradation caused by CREST FACTOR REDUCTION is below the maximum acceptable ERROR VECTOR MAGNITUDE, or increasing the CREST FACTOR REDUCTION threshold until the ERROR VECTOR MAGNITUDE degradation caused by CREST FACTOR REDUCTION reaches the maximum acceptable ERROR VECTOR MAGNITUDE degradation if the ERROR VECTOR MAGNITUDE degradation caused by CREST FACTOR REDUCTION is not below the maximum acceptable ERROR VECTOR MAGNITUDE degradation.

The above described device can further comprise a hard limiter for limiting the processed input signal.

Figure 6:
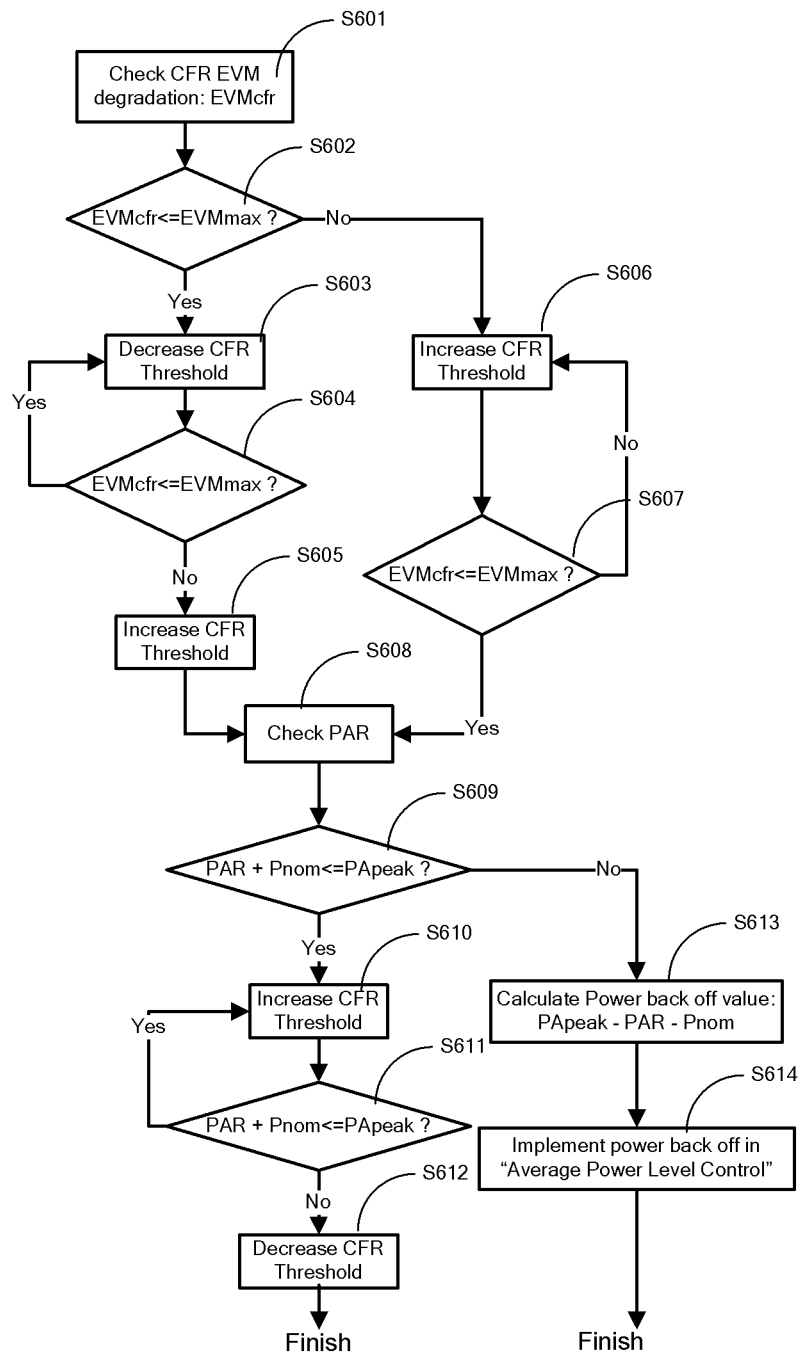
FIG. 6 is another flowchart illustrating an embodiment of method steps.

FIG. 6 is a flow chart of a method for controlling an input signal of a power amplifier in accordance with another example embodiment.

In step S601, EVM degradation cause by CFR is checked and the EVM degradation value is named as EVMcfr.

In step S602, EVMcfr is compared with EVMmax, which is the maximum acceptable error vector magnitude degradation. If EVMcfr<=EVMmax, then the process goes to step S603, in which CFR threshold is decreased by a predetermined amount. Or otherwise, the process goes to step S606.

After step S603, the process goes to step S604, in which EVMcfr is compared with EVMmax again. And if EVMcfr<=EVMmax still, then the process goes back to step S603. If EVMcfr<=EVMmax does not hold anymore, then the process goes to step S605.

In step S605, the CFR threshold is increased. Step S605 prevents the CFR threshold to be overly decreased at the last S603-S604 cycle, and aims to ensure the CFR threshold to be the lowest acceptable value.

In step S606, the CFR threshold is increased by a predetermined amount.

In step 607, EVMcfr is compared with EVMmax again, if it does not hold still, then the process goes back to step S606 again. Or otherwise, the process goes to step S608.

In step S608, the PAR is checked.

In step S609, the sum of PAR and Pnom, which is the average output power of the PA, is compared with PApeak, which is the allowable peak power. If the sum<=PApeak, then the process goes to step S610, or otherwise, it goes to step S613.

In step S610, CFR threshold is increased by a predetermined amount.

In step S611, the sum of PAR and Pnom is compared with PApeak again. If the sum<=PApeak still, then the process goes back to step S610. Or otherwise, the process goes to step S612.

In step S612, the CFR threshold is decreased by a predetermined amount, so as to prevent the CFR threshold to be overly increased at the last S610-S611 cycle and the finally determined CFR threshold is the optimized value.

In step S613, the power back off value is calculate as "PApeak-PAR-Pnom."

In step S614, the average power of the input signal is controlled by applying the power back off value. Then the final peak power is equal to the allowable peak power.

According to embodiments of the invention, CFR threshold is adjusted based on input signal rather than output signal of a power amplifier, and thus can support all kinds of carrier configurations, such as WiMAX and multi-standards scenarios.

Although the present disclosure has been described with exemplary embodiments, various changes and modifications may be suggested to one skilled in the art. It is intended that the present disclosure encompasses such changes and modifications as fall within the scope of the appended claims.

The invention claimed is:

1. A method for controlling an input signal of a power amplifier, comprising:
    applying Crest Factor Reduction, using an initial Crest Factor Reduction threshold, to the input signal to obtain a processed input signal;
    determining a minimum Crest Factor Reduction threshold such that an Error Vector Magnitude degradation caused by applying Crest Factor Reduction using the minimum Crest Factor Reduction threshold comprises a maximum acceptable Error Vector Magnitude degradation;
    comparing a Peak-to-Average Ratio of the processed input signal plus an average output power of the power amplifier and an allowable peak power of the power amplifier; and
    if the Peak-to-Average Ratio plus the average output power is below the allowable peak power, determining a final Crest Factor Reduction threshold by increasing the minimum Crest Factor Reduction threshold until the Peak-to-Average Ratio plus the average output power reaches the allowable peak power, or
    if the Peak-to-Average Ratio plus the average output power is not below the allowable peak power, determining the final Crest Factor Reduction threshold to be the minimum Crest Factor Reduction threshold, and reducing the average output power until the Peak-to-Average Ratio plus the average output power reaches the allowable peak power.

2. The method of claim 1, wherein determining the minimum Crest Factor Reduction threshold comprises:
    comparing the Error Vector Magnitude degradation caused by applying Crest Factor Reduction using the initial Crest Factor Reduction threshold with the maximum acceptable Error Vector Magnitude degradation; and
    if the Error Vector Magnitude degradation is below the maximum acceptable Error Vector Magnitude degradation, decreasing the initial Crest Factor Reduction threshold until the Error Vector Magnitude degradation reaches the maximum acceptable Error Vector Magnitude degradation, or
    if the Error Vector Magnitude degradation is not below the maximum acceptable Error Vector Magnitude degradation, increasing the initial Crest Factor Reduction threshold until the Error Vector Magnitude degradation reaches the maximum acceptable Error Vector Magnitude degradation.

3. The method of claim 1 further comprising limiting the processed input signal.

4. The method of claim 1, comprising:
increasing the minimum Crest Factor Reduction threshold step by step, wherein an amount of increase between steps is determined based on a difference between the Peak-to-Average Ratio plus the average output power and the allowable peak power.

5. The method of claim 2, comprising:
decreasing or increasing the Crest Factor Reduction threshold step by step, wherein an amount of increase or decrease between steps is determined based on a difference between the Error Vector Magnitude degradation and the maximum acceptable Error Vector Magnitude degradation.

6. A device for controlling an input signal of a power amplifier, the device comprising:
a Crest Factor Reduction unit configured to apply Crest Factor Reduction, using an initial Crest Factor Reduction threshold, to the input signal to obtain a processed input signal;
a minimum Crest Factor Reduction threshold determiner configured to determine a minimum Crest Factor Reduction threshold such that an Error Vector Magnitude degradation caused by applying Crest Factor Reduction using the minimum Crest Factor Reduction threshold comprises a maximum acceptable Error Vector Magnitude degradation;
a power comparator configured to compare a Peak-to-Average Ratio of the processed input signal plus an average output power of the power amplifier and an allowable peak power of the power amplifier;
a final Crest Factor Reduction threshold determiner configured to determine a final Crest Factor Reduction threshold by increasing the minimum Crest Factor Reduction threshold until the Peak-to-Average Ratio plus the average output power reaches the allowable peak power if the Peak-to-Average Ratio plus the average output power is below the allowable peak power, or determining the final Crest Factor Reduction threshold to be the minimum Crest Factor Reduction threshold if the Peak-to-Average Ratio plus the average output power is not below the allowable peak power; and
an average output power control unit configured to reduce the average output power until the Peak-to-Average Ratio plus the average output power reaches the allowable peak power if the Peak-to-Average Ratio plus the average output power is not below the allowable peak power.

7. The device of claim 6, wherein the minimum Crest Factor Reduction threshold determiner comprises:
an Error Vector Magnitude comparator configured to compare the Error Vector Magnitude degradation caused by applying Crest Factor Reduction using the initial Crest Factor Reduction threshold with the maximum acceptable Error Vector Magnitude degradation;
a Crest Factor Reduction threshold adjuster configured to:
decrease the initial Crest Factor Reduction threshold until the Error Vector Magnitude degradation caused by applying Crest Factor Reduction using the decreased initial Crest Factor Reduction threshold reaches the maximum acceptable Error Vector Magnitude degradation if the Error Vector Magnitude degradation caused by applying Crest Factor Reduction using the decreased initial Crest Factor Reduction threshold is below the maximum acceptable Error Vector Magnitude, or
increase the initial Crest Factor Reduction threshold until the Error Vector Magnitude degradation caused by applying Crest Factor Reduction using the increased initial Crest Factor Reduction threshold reaches the maximum acceptable Error Vector Magnitude degradation if the Error Vector Magnitude degradation caused by applying Crest Factor Reduction using the increased initial Crest Factor Reduction threshold is not below the maximum acceptable Error Vector Magnitude degradation.

8. The device of claim 6, further comprising a hard limiter for limiting the processed input signal.

9. The device of claim 6 is a base station or a terminal.

10. A non-transitory computer readable medium, with computer code stored thereon, which when executed by a processor causes the processor to control an input signal of a power amplifier, the processor operable to:
apply Crest Factor Reduction, using an initial Crest Factor Reduction threshold, to the input signal to obtain a processed input signal;
determine a minimum Crest Factor Reduction threshold for applying Crest Factor Reduction such that an Error Vector Magnitude degradation caused by applying Crest Factor Reduction using the minimum Crest Factor Reduction threshold comprises a maximum acceptable Error Vector Magnitude degradation;
compare a Peak-to-Average Ratio of the processed input signal plus an average output power of the power amplifier and an allowable peak power of the power amplifier,
determine a final Crest Factor Reduction threshold by increasing the minimum Crest Factor Reduction threshold until the Peak-to-Average Ratio plus the average output power reaches the allowable peak power when the Peak-to-Average Ratio plus the average output power is below the allowable peak power, and
determine the final Crest Factor Reduction threshold to be the minimum Crest Factor Reduction threshold and reduce the average output power until the Peak-to-Average Ratio plus the average output power reaches the allowable peak power when the Peak-to-Average Ratio plus the average output power is not below the allowable peak power.

11. The computer readable medium of claim 10, wherein the processor is operable to:
compare the Error Vector Magnitude degradation caused by applying Crest Factor Reduction using the initial Crest Factor Reduction threshold with the maximum acceptable Error Vector Magnitude degradation;
decrease the initial Crest Factor Reduction threshold until Error Vector Magnitude degradation caused by applying Crest Factor Reduction using the decreased initial Crest Factor Reduction threshold reaches the maximum acceptable Error Vector Magnitude degradation when the Error Vector Magnitude degradation caused by applying Crest Factor Reduction using the decreased initial Crest Factor Reduction threshold is below the maximum acceptable Error Vector Magnitude degradation; and
increase the initial Crest Factor Reduction threshold until Error Vector Magnitude degradation caused by applying Crest Factor Reduction using the increased initial Crest Factor Reduction threshold reaches the maximum acceptable Error Vector Magnitude degradation when the Error Vector Magnitude degradation caused by applying Crest Factor Reduction using the increased initial Crest Factor Reduction threshold is not below the maximum acceptable Error Vector Magnitude degradation.

12. The computer readable medium of claim 10, the processor configured to limit the processed input signal.

13. A device for controlling an input signal of a power amplifier, comprising:
   a Crest Factor Reduction unit,
   an average power meter coupled to an output of the Crest Factor Reduction unit,
   a peak power meter coupled to the output of the Crest Factor Reduction unit,
   a Peak-to-Average Ratio meter configured to determine a Peak-to-Average Ratio according to outputs of the average power meter and the peak power meter, and to determine whether the Peak-to-Average Ratio plus an average output power of the power amplifier is below an allowable peak power of the power amplifier,
   an average power level controller configured to control an average power level of the input signal based on an output of the Peak-to-Average Ratio meter,
   an Error Vector Magnitude calculator, with inputs from both the output of the average power level controller and the output of the Crest Factor Reduction unit, and
   a threshold determiner configured to determine a Crest Factor Reduction threshold based on outputs of the Peak-to-Average Ratio meter and the Error Vector Magnitude calculator.

14. The device of claim 13 further comprising a hard limiter configured to limit the output of the Crest Factor Reduction unit.

15. The device of claim 13 further comprising a delay unit between the output of the average power level controller and the input of the Error Vector Magnitude calculator.

16. A signal transmitter, comprising:
   a signal source,
   a power amplifier,
   a signal processor configured to process a signal from the signal source for the power amplifier, the signal processor comprising:
      a Crest Factor Reduction unit,
      an average power meter connected with an output of the Crest Factor Reduction unit,
      a peak power meter connected with the output of the Crest Factor Reduction unit,
      a Peak-to-Average Ratio meter configured to determine a Peak-to-Average Ratio according to an output of the average power meter and the peak power meter, and to determine whether the Peak-to-Average Ratio plus an average output power of the power amplifier is below an allowable peak power of the power amplifier,
      an average power level controller configured to control an average power level of the signal from the signal source based on an output of the Peak-to-Average Ratio meter,
      an Error Vector Magnitude calculator, with inputs from both an output of the average power level controller and the output of the Crest Factor Reduction unit, and
      a threshold determiner configured to determine a Crest Factor Reduction threshold based on the output of the Peak-to-Average Ratio meter and the Error Vector Magnitude calculator.

\* \* \* \* \*